US012088058B2

(12) United States Patent
DuBois et al.

(10) Patent No.: US 12,088,058 B2
(45) Date of Patent: Sep. 10, 2024

(54) COOLING OF A LASER SET

(71) Applicant: The Government of the United States, as represented by the Secretary of the Army, Washington, DC (US)

(72) Inventors: Terry DuBois, Forest Hill, MD (US); Jaclyn Lynch, Baltimore, MD (US); Eric Conrad, Baltimore, MD (US)

(73) Assignee: The Government of the United States, represented by the Secretary of the Army

( * ) Notice: Subject to any disclaimer, the term of this patent is extended or adjusted under 35 U.S.C. 154(b) by 409 days.

(21) Appl. No.: 17/493,876

(22) Filed: Oct. 5, 2021

(65) Prior Publication Data

US 2022/0109283 A1 Apr. 7, 2022

Related U.S. Application Data

(60) Provisional application No. 63/087,900, filed on Oct. 6, 2020.

(51) Int. Cl.
*H01S 5/024* (2006.01)

(52) U.S. Cl.
CPC ...... *H01S 5/02423* (2013.01); *H01S 5/02438* (2013.01)

(58) Field of Classification Search
CPC .................................................. H01S 5/02423
See application file for complete search history.

(56) References Cited

U.S. PATENT DOCUMENTS

2015/0138723 A1* 5/2015 Shedd ..................... F25B 41/00
165/104.29

* cited by examiner

*Primary Examiner* — Tuan N Nguyen
(74) *Attorney, Agent, or Firm* — Ronald Krosky

(57) ABSTRACT

Various embodiments that pertain to cooling of a laser set are described. In one example, the lasers can be a set of laser diodes. A laser diode cooling system can create a vacuum environment that causes a coolant to be below atmospheric pressure. The coolant can be water supplied by an exchangeable tank. When the tank is empty, the tank can be replaced with a new tank.

15 Claims, 16 Drawing Sheets

Table 1. Examples of Expendable Coolants

| Fluids | Saturation Temperature (°C) | Heat of Vaporization (kJ/kg) at saturation temp. and 1 atm | Liquid Density (kg/m$^3$) at saturation temp. and 1 atm |
|---|---|---|---|
| Water | 100 | 2257 | 959 |
| Nitrogen | -196 | 199 | 806 |
| Oxygen | -183 | 213 | 1142 |
| Argon | -186 | 169 | 1396 |
| Ammonia | -33.3 | 1371 | 0.876 |
| Methanol | 64.7 | 1100 | 792 |

FIG. 11

COOLING OF A LASER SET

CROSS-REFERENCE

The application claims priority to U.S. Application No. 63/087,900, a provisional patent application, filed on Oct. 6, 2020. U.S. Application No. 63/087,900 is hereby incorporated by reference.

GOVERNMENT INTEREST

The innovation described herein may be manufactured, used, imported, sold, and licensed by or for the Government of the United States of America without the payment of any royalty thereon or therefor.

BACKGROUND

Lasers can be used in a wide variety of commercial applications, such as welding and cutting and can also be used in military applications such as directed energy weapons. These lasers can have desirable operating characteristics. When these lasers deviate from the desirable operating characteristics, the performance of the lasers can suffer and therefore the applications can suffer. In view of this, it can be beneficial to keep the lasers within the desirable operating characteristics.

SUMMARY

In one embodiment, a laser diode cooling system comprises a cooling apparatus and a vacuum pump. The cooling apparatus can be configured to cool a laser diode set through employment of a coolant. The vacuum pump can be configured to keep the coolant at less than an atmospheric pressure of the laser diode set.

In another embodiment, a laser diode set cooling system comprises reservoir coupling hardware and a laser diode cooling plate. The reservoir coupling hardware can be configured to couple and decouple with a reservoir containing a coolant. The laser diode cooling plate can be configured to pass through the coolant from the reservoir, where the coolant passing through the laser diode cooling plate causes a laser diode set to cool and where the coolant is supplied to the laser diode cooling plate at a pressure less than an atmospheric pressure of the laser diode set.

In yet another embodiment, a method to cool a laser set by way of a laser cooling system can comprise extracting a first amount of a coolant from a first coolant reservoir and cooling the laser set through employment of the first amount of the coolant. The method can also comprise extracting a second amount of a coolant from a second coolant reservoir and cooling the laser set through employment of the second amount of the coolant. The second coolant reservoir can physically replace the first coolant reservoir such that the first coolant reservoir and second coolant reservoir are not coupled to the laser cooling system concurrently.

BRIEF DESCRIPTION OF THE DRAWINGS

Incorporated herein are drawings that constitute a part of the specification and illustrate embodiments of the detailed description. The detailed description will now be described further with reference to the accompanying drawings as follows:

FIG. 11 illustrates on embodiment of a table comparing fluids as coolants;

Figure 1A:
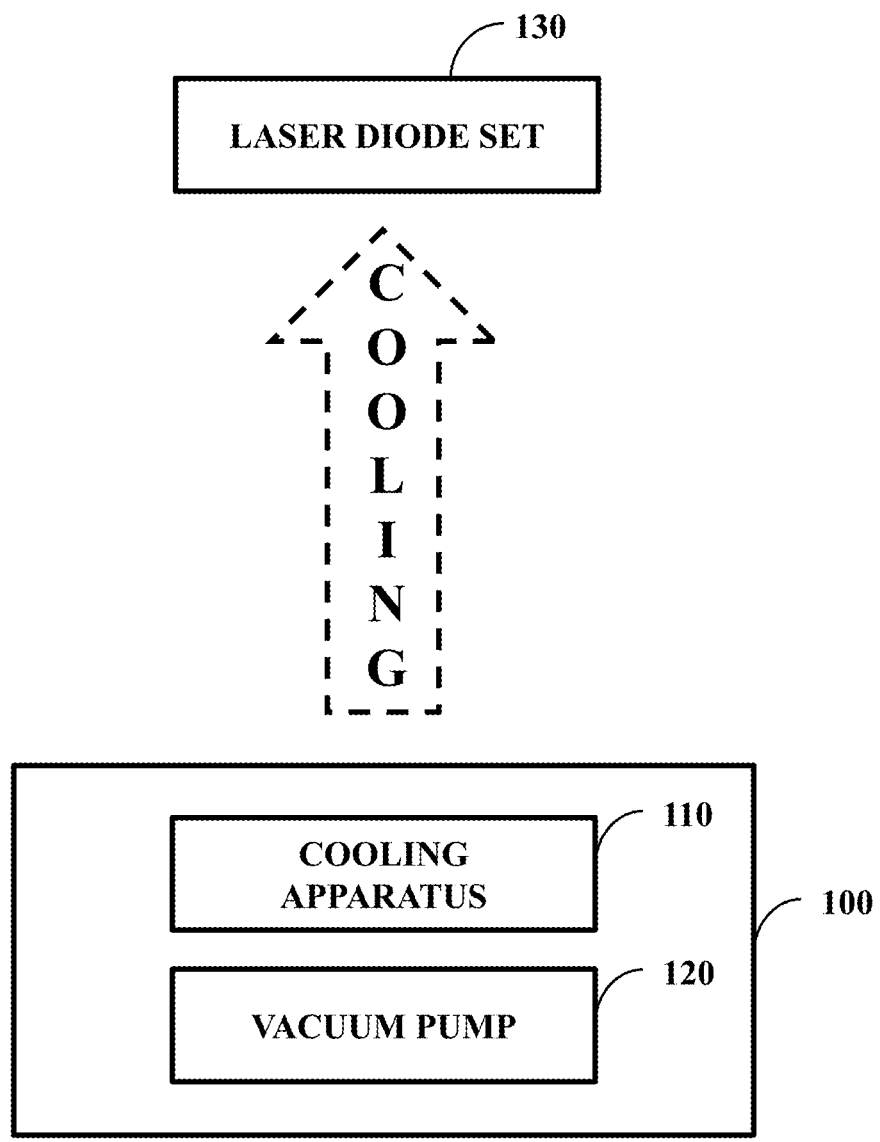
FIG. 1A illustrates one embodiment of a system comprising a cooling apparatus and a vacuum pump.

Figures can be referred to collectively. For example, a reference to "the cooling apparatus of FIG. 1" can refer to the cooling apparatus as illustrated in FIG. 1A as well as FIG. 1B.

DETAILED DESCRIPTION

When a laser set operates, the laser set can function with high heat production. This high heat production, if not removed, can result in elevated laser set operating temperatures, outside of a desired operating temperature for the laser set. Therefore, the laser set can reject heat to function properly.

Laser set produced heat can, in one embodiment, be removed by a flowing coolant within a cold plate. The coolant can remove heat under single-phase conditions (e.g. liquid water-glycol coolant) or under two-phase (liquid/vapor) conditions (e.g. R-134a refrigerant). Two phase cooling can be used in laser diode set cooling, as laser diodes benefit from tight temperature control and two-phase heat transfer, using pure substances as a coolant, can take place at a constant temperature. The combination of laser set desired operating temperature and preferred coolant pressure determines an appropriate coolant based on the coolant's physical properties. This can allow for the use of expendable coolants for constant temperature heat rejection for diode-pumped solid state lasers.

Coolants can be designed to operate at pressures above atmospheric. However, coolants can be used in a vacuum, or partial vacuum, environment. Water or other high boiling point coolants can be employed as the coolant that is accessed from a tank or reservoir. A high boiling point coolant can be a coolant whose boiling point temperature at atmospheric pressure is above the desired operating temperature of the laser set. The vacuum environment can reduce the saturation temperature for the coolant allowing the high boiling point coolant to operate at a lower desired temperature. When the coolant runs out, the tank or reservoir can be replaced or replenished.

The following includes definitions of selected terms employed herein. The definitions include various examples. The examples are not intended to be limiting.

"One embodiment", "an embodiment", "one example", "an example", and so on, indicate that the embodiment(s) or example(s) can include a particular feature, structure, characteristic, property, or element, but that not every embodiment or example necessarily includes that particular feature, structure, characteristic, property, or element. Furthermore, repeated use of the phrase "in one embodiment" may or may not refer to the same embodiment.

"Computer-readable medium", as used herein, refers to a medium that stores signals, instructions and/or data. Examples of a computer-readable medium include, but are not limited to, non-volatile media and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, other optical medium, a Random Access Memory (RAM), a Read-Only Memory (ROM), a memory chip or card, a memory stick, and other media from which a computer, a processor or other electronic device can read. In one embodiment, the computer-readable medium is a non-transitory computer-readable medium.

"Component", as used herein, includes but is not limited to hardware, firmware, software stored on a computer-readable medium or in execution on a machine, and/or combinations of each to perform a function(s) or an action(s), and/or to cause a function or action from another component, method, and/or system. Component may include a software controlled microprocessor, a discrete component, an analog circuit, a digital circuit, a programmed logic device, a memory device containing instructions, and so on. Where multiple components are described, it may be possible to incorporate the multiple components into one physical component or conversely, where a single component is described, it may be possible to distribute that single component between multiple components.

"Software", as used herein, includes but is not limited to, one or more executable instructions stored on a computer-readable medium that cause a computer, processor, or other electronic device to perform functions, actions and/or behave in a desired manner. The instructions may be embodied in various forms including routines, algorithms, modules, methods, threads, and/or programs, including separate applications or code from dynamically linked libraries.

Figure 1B:
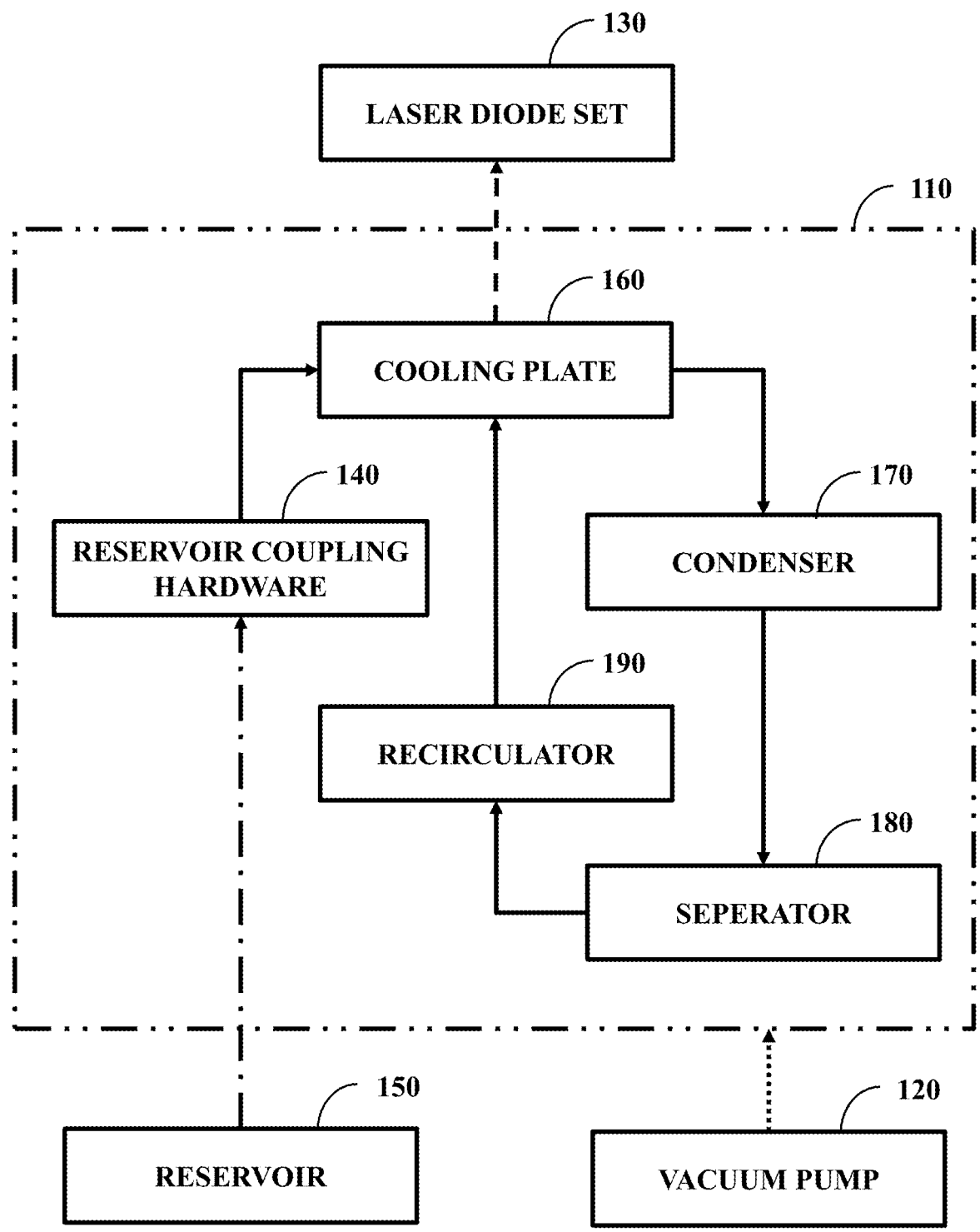
FIG. 1B illustrates one embodiment of the cooling apparatus.

FIG. 1A illustrates one embodiment of a system 100 comprising a cooling apparatus 110 and a vacuum pump 120 while FIG. 1B illustrates one embodiment of the cooling apparatus 110. The cooling apparatus 100 (e.g., a heat rejection apparatus) can be configured to cool a laser set, such as a laser diode set 130, through employment of a coolant. The vacuum pump 120 can be configured to keep the coolant at less than an atmospheric pressure of the laser diode set 130. After the coolant cools the laser diode set 130, the coolant can be rejected into the environment.

In one example, the laser diode set 130 can be a set of 1000 diodes. The individual diodes can output 100 watts so the total output of the laser diode set 130 is 100 kilowatt (kW) when the output of the individual diodes are optically combined. The individual diodes can have a preferred (e.g., optimal) operating temperature. In this example, the preferred operating temperature can be 40 degrees Celsius. While an example diode number, output, and operating temperature are provided, one of ordinary skill in the art will appreciate different values can be used.

If the individual diodes vary from this preferred operating temperature, their performance can be impacted. For example, if the temperature is not preferred, the wavelength emitted by the individual diode can be different than desired. This can cause a laser device employing the laser diode set 130 to not function properly.

To keep the laser diode set 130 at an appropriate temperature, the cooling apparatus 110 can use a coolant. In one embodiment, the cooling apparatus 110 can use a low boiling point coolant (e.g., R134a refrigerant) in a pressurized environment. A low boiling point coolant can be a coolant whose boiling point temperature at atmospheric pressure is bellowing the desired operating temperature of the laser diode set 130. In some applications, a low boiling point coolant in a pressurized environment can be beneficial, but it can have drawbacks, such as when used in a closed cycle (e.g., vapor compression cycle). In one example, if the cooling apparatus 100 uses a low boiling point coolant in a closed pressurized system, then the cooling apparatus 110 can provide cooling to the laser diode set 130 for an extended period of time. However, this can also result in a large and heavy cooling apparatus 110, making the laser device relatively immobile and impractical in some applications.

As an alternative, the cooling apparatus 110 can function in a vacuum environment (e.g., full vacuum or partial vacuum) facilitated by the vacuum pump 120. However, in the vacuum environment, it may be more beneficial to operate the laser device sporadically, such as for a total of two to five minutes over a thirty minute window. With this vacuum environment, the cooling apparatus 110 can be physically smaller than the closed cycle pressurized environment.

FIG. 1B illustrates one embodiment of the cooling apparatus 110 that can function in the vacuum environment facilitated by the vacuum pump 120 to cool the laser diode set 130. The cooling apparatus 110 can include a reservoir coupling hardware 140 that couples to a reservoir 150 of coolant (e.g., water). The water can be passed through a cooling plate 160 such that the pass through of the coolant causes the laser diode 130 set to be cooled.

The liquid part can pass through a condenser 170, separator 180, and then move to a recirculator 190. The condenser 170 can remove heat from the coolant, condensing more coolant, resulting in an increased amount of coolant in liquid form and an increased cooling capacity for the system 100. The separator 180 can separate a liquid part of the condensed coolant from a vapor part. The recirculator 190 (e.g., a liquid pump) can recirculate the liquid part (e.g., the separated and recirculated liquid) and therefore at least part of the coolant employed to meet the cooling plate 160 demand. In one embodiment, there can be a preference to use the liquid part before using coolant from the reservoir to keep the size of the separator 180 smaller.

A controller can function to manage the cooling apparatus 110. The controller can comprise a temperature control component configured to adjust the temperature of the coolant before it enters the cooling plate 160. Since coolant can come from the separator 180 and reservoir 150, the coolant can be at different temperatures, one or both undesirable, the temperature control component can control the coolant to interact with the cooling plate at a desired temperature. In one example, the temperature control component can manage a thermoelectric device that heats and/or cools.

After being passed through the cooling plate, where heat is absorbed via a coolant phase change, the coolant can be processed by a separator 180 that can separate the coolant that passes through the cooling plate 160 to a vapor part and a liquid part. The liquid part can be recirculated while the vapor part can be released into an environment outside of the laser diode cooling system. The vapor-to-liquid ratio can be about 20-30% (e.g., mass percentage) vapor to about 70-80% (e.g., mass percentage) liquid; this can add to about 100%. The actual mass percent of vapor can determined by improving (e.g. optimizing) the coolant heat transfer coefficient and pumping power (e.g., mass flow rate of coolant).

With this, the cooling apparatus 110 can operate in multiple phases. For example, two cooling phases can occur. A first phase can be cooling with at least some coolant directly from the reservoir 150 (e.g., all the coolant from the reservoir 150). A second phase can be cooling with at least some coolant that is recirculated, with the first cooling phase occurring before the second cooling phase.

Different implementations can occur as well. Liquid from the separator 180 can be employed if available (e.g., coolant exclusively from the separator 180, such as when the cooling plate 150 has no thermal heat rejection). If the liquid from the separator 180 is insufficient, then the coolant can be supplemented with supply from the reservoir 150. Conversely, the cooling apparatus 110 can use coolant from the reservoir 150 if available (e.g., coolant exclusively from the reservoir) and if insufficient, then the cooling apparatus 110 uses separator coolant. Also, coolant can be used from the reservoir if about all coolant is vaporized from the cooling plate 160. Further, the cooling apparatus 110 can employ reservoir coolant and separator coolant.

The cooling phases can continue until the reservoir 150 is out of coolant and there is no more coolant to circulate. As an example of when there is no more coolant to circulate, there can be not a large enough liquid part exiting the separator 180 to successfully cool the laser diode set 130 by way of the cooling plate 160. In response to this, the reservoir 150 can be replaced (e.g., a tank refilled or completely replaced).

With this, the reservoir coupling hardware can be configured to couple and decouple with a first reservoir and configured to couple and decouple with a second reservoir. The first and second reservoirs can be of the same size (e.g., dimensions or coolant contained) or different sizes. Additionally, the coolant of the first and second reservoirs can be the same or different. The first and second reservoirs can be attached at the same time (e.g., coolant pulled from one first and then the other or pulled in a balanced manner) or one can be attached and then the other.

Various other implementations can take place. For example, in one embodiment, the two reservoirs can be about equal (e.g., retain equal amounts of the coolant and/or are the same coolant). Non-identical coolants can have different thermophysical properties resulting in a change to the temperature and pressure where phase change occurs and thus heat is absorbed. The controller could retain logic to determine saturation pressure to achieve desired operating pressure.

Figure 2:
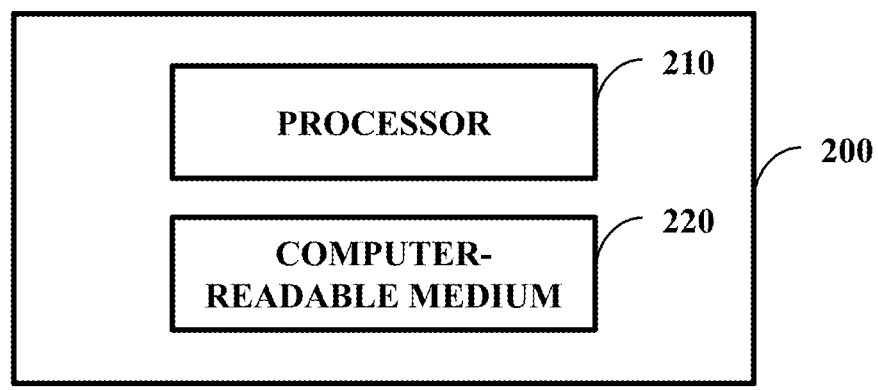
FIG. 2 illustrates one embodiment of a system comprising the processor and the computer-readable medium.

FIG. 2 illustrates one embodiment of a system 200 comprising the processor 210 and the computer-readable medium 220 (e.g., non-transitory computer-readable medium). In one embodiment, the computer-readable medium 220 is communicatively coupled to the processor 210 and stores a command set executable by the processor 210 to facilitate operation of at least one component disclosed herein, such as the temperature control component of cooling apparatus controller discussed in FIG. 1. In one embodiment, at least one component disclosed herein, such as a vacuum pump controller component configured to control the vacuum pump 120 of FIG. 1 so that the proper vacuum level is maintained or a determination component disclosed herein, can be implemented, at least in part, by way of non-software, such as implemented as hardware by way of the system 200. In one embodiment, the computer-readable medium 220 is configured to store processor-executable instructions that when executed by the processor 210, cause the processor 210 to perform at least part of a method disclosed herein (e.g., at least part of one of the methods 300-700 discussed below).

Figure 3:
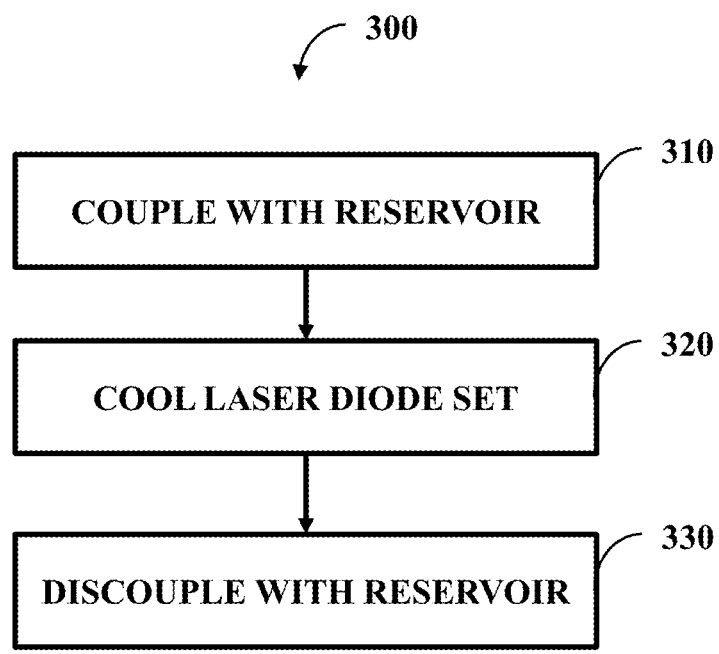
FIG. 3 illustrates one embodiment of a method comprising three actions.

FIG. 3 illustrates one embodiment of a method 300 comprising three actions 310-330. At 310, there can be coupling the cooling apparatus 110 of FIG. 1 with the reservoir 150 of FIG. 1 that holds the coolant (e.g., by way of the reservoir coupling hardware 140 of FIG. 1). At 320, the laser diode set 130 of FIG. 1 can be cooled. This can be produced by coolant from the reservoir (e.g., supplied at a pressure less than an atmospheric pressure of the laser diode set 130 of FIG. 1) being passed through the laser diode cooling plate 160 of FIG. 1 to cool the laser diode set 130 of FIG. 1. At 330, there can be decoupling the cooling apparatus 110 of FIG. 1 with the reservoir 150 of FIG. 1 (e.g., by way of the reservoir coupling hardware 140 of FIG. 1).

Cooling the laser diode set 320 can also be more involved. In on example, the coolant can be water. At 320, after the coolant passes through the laser diode cooling plate 160 of FIG. 1, considered the initial time, it is separated into a vapor part and a liquid part (e.g., by the separator 180 of FIG. 1), such as into the 20-30% vapor part and 70-80% liquid part as discussed above. The liquid part can pass through the laser diode cooling plate 160 of FIG. 1 a subsequent time after the initial time, such as by recirculation hardware (e.g., a liquid pump and pipes) and the vapor part can be environmentally released. This can continue until the cooling apparatus 110 of FIG. 1 runs out of coolant.

In one embodiment, coolant can be replaced by way of a replicable reservoir. A first reservoir can retain a first amount of coolant and this first amount coolant can be used to cool the laser diode set 130 of FIG. 1. When that coolant runs out, a second reservoir can replace the first reservoir (e.g., same amount of coolant or different) at the same connection point.

Figure 4:
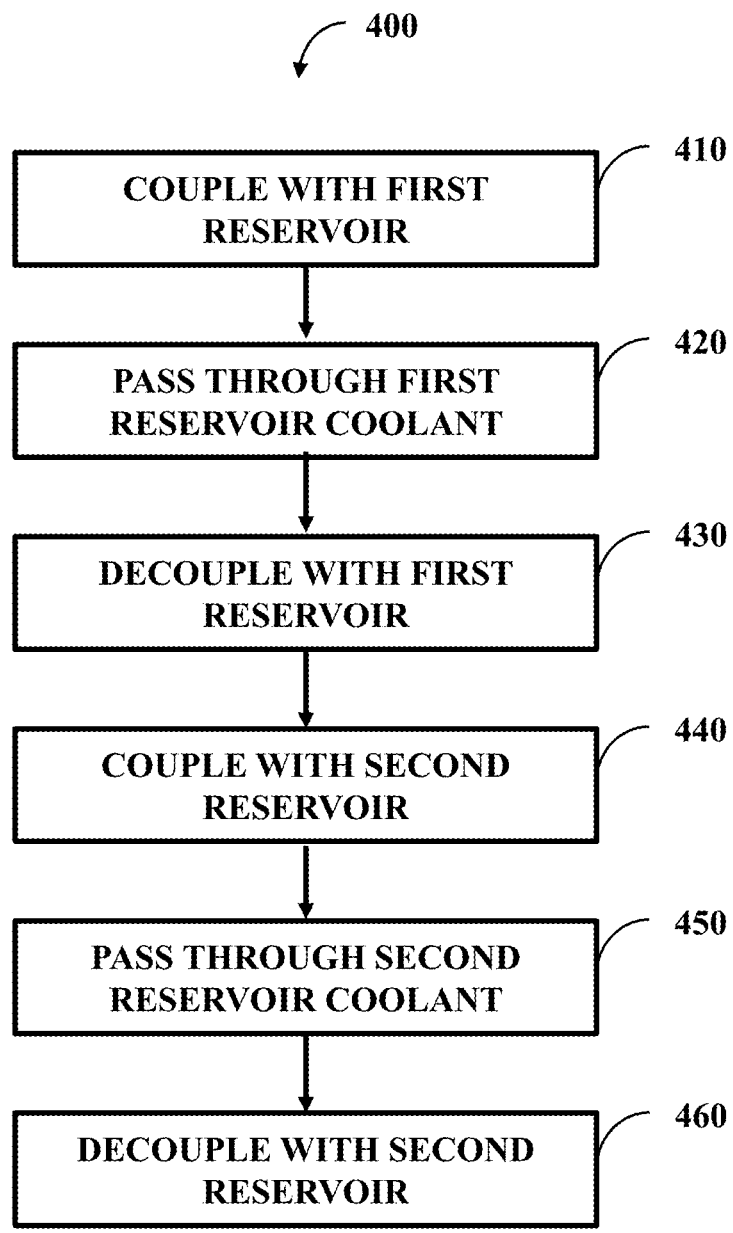
FIG. 4 illustrates one embodiment of a method comprising six actions.

FIG. 4 illustrates one embodiment of a method 400 comprising six actions 410-460. The method 400 can address reservoir replacement of a first reservoir coupled to the reservoir coupling hardware 140 of FIG. 1 at 410. At 420, the coolant can be extracted from the first reservoir, pass through the plate 160 of FIG. 1 and be recirculated as discussed above. The first reservoir can be decoupled at 430, such as when the first reservoir is out of coolant. At 440, the second reservoir can be coupled at 440, the coolant of the second reservoir can pass through the plate 140 of FIG. 1 at 450, and can be decoupled at 460.

Figure 5:
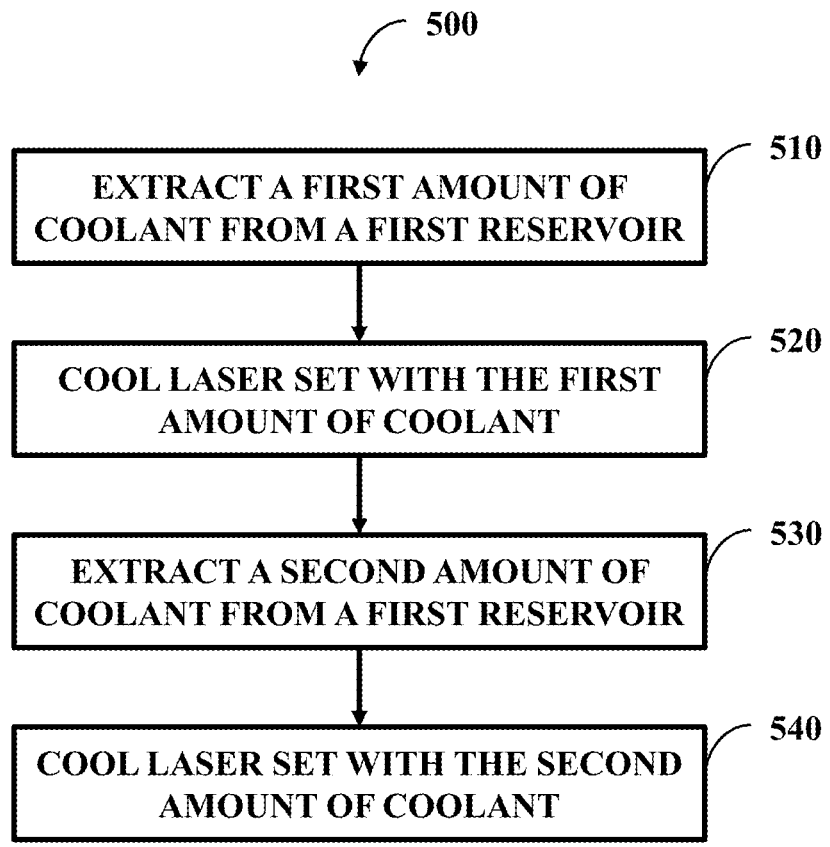
FIG. 5 illustrates one embodiment of a method comprising four actions.

FIG. 5 illustrates one embodiment of a method 500 comprising four actions 510-540. At 510, there can be extracting a first amount of a coolant from a first coolant reservoir and at 520 there can be cooling the laser set through employment of the first amount of the coolant. At 530, there can be extracting a second amount of a coolant from a second coolant reservoir and at 540 there can be cooling the laser set through employment of the second amount of the coolant. The second coolant reservoir can physically replace the first coolant reservoir such that the first coolant reservoir and second coolant reservoir are not coupled to a laser cooling system (e.g., the system 100 of FIG. 1) concurrently. The first reservoir and the second reservoir can be employed in cooling, even if they are different sizes.

Cooling at 520 and/or 540 can occur in multiple iterations, such as when the first reservoir and the second reservoir contain water as the coolant. For example, 520 and/or 540 can implement as cooling the laser diode set 130 of FIG. 1 through employment of the first amount of the coolant during a first iteration, separating the first amount of the coolant to a first vapor portion and a first liquid portion after the first iteration (e.g., with a vapor part of about 20-30% and a liquid part of about 70-80%), and then cooling the laser set through employment of the first liquid portion during a second iteration that follows the first iteration. At 520 and/or 540 there can also include condensing the first coolant portion before so that the laser diode set 130 of FIG. 1 is cooled through employment of a condensed version of the first liquid portion during the second iteration that follows the first iteration. With this, there can be a higher yield of the liquid portion as a result of the condensing. At 520 and/or 540 there can additionally be releasing the first vapor portion into a surrounding environment of the system 100 of FIG. 1, with there being less of the first vapor portion as a result of the condensing.

Figure 6:
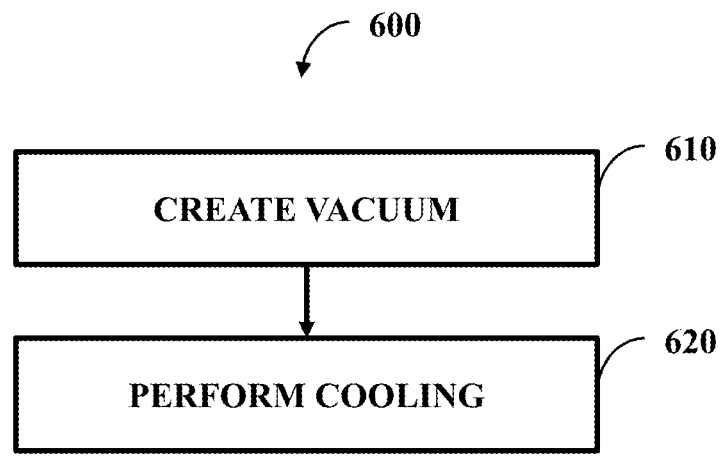
FIG. 6 illustrates one embodiment of a method comprising two actions.

FIG. 6 illustrates one embodiment of a method 600 comprising two actions 610-620. At 610, a vacuum can be created for the cooling apparatus 110 of FIG. 1, such as by the vacuum pump 120 of FIG. 1. Cooling can occur at 620, such as through implementation of at least part of the method 500 of FIG. 5. With this, the first and second amounts of coolant can be used in cooling at less than atmospheric pressure of the laser diode set 130 of FIG. 1 due to the vacuum environment.

Figure 7:
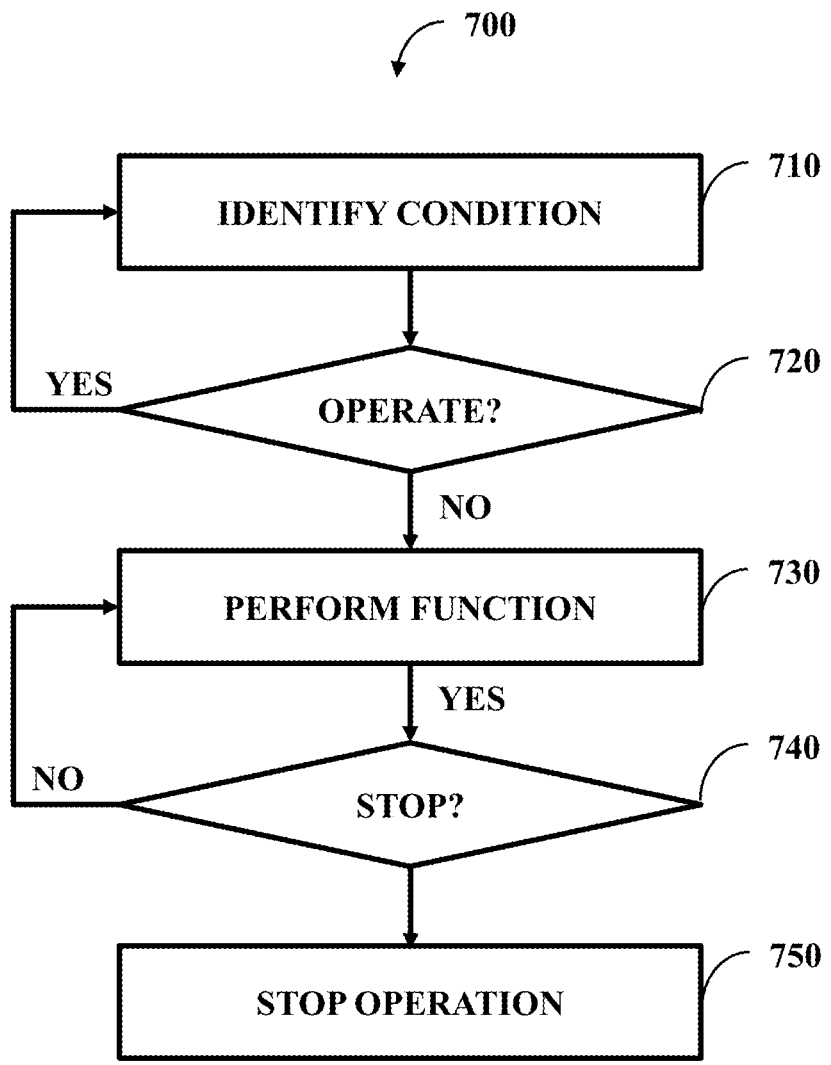
FIG. 7 illustrates one embodiment of a method comprising five actions.

FIG. 7 illustrates one embodiment of a method 700 comprising five actions 710-750. The method 700 can be for determining when to operate the laser diode set 130 of FIG. 1 and can begin with identifying a condition at 710. In one example, if the laser diode set is employed in a laser welding apparatus, a condition can be if an instruction is received to run the welding apparatus. A check 720 can determine if the laser diode set 130 of FIG. 1 should operate in response to the determined condition and in turn if the system 100 of FIG. 1 should function to cool the laser diode set 130 of FIG. 1. If the determination results in non-operation, then the method 700 can return to 710 to continue making condition identifications.

If the check 720 results in a determination that operation should occur, then the method 700 can continue to 730 where the function is performed. In this example, the function being performed is the laser welder operating. A check 740 can function to determine if the operation should stop. The check 740 can run by the same process as check 720, such as if an instruction is received to stop operation. However, other aspects can occur as well, such as if a safety failure occurs necessitating operation to stop. If no reason to stop is active, then the function can continue to be performed. If a reason is given, then the operation can be stopped at 750.

While the methods disclosed herein are shown and described as a series of blocks, it is to be appreciated by one of ordinary skill in the art that the methods are not restricted by the order of the blocks, as some blocks can take place in different orders.

Pumped laser diode solid state energy systems, such as weapon systems, can be hindered by inadequate size, weight, and power (SWaP) improvements (e.g., optimization). Diode-pumped solid state laser systems exhibit low energy conversion efficiencies resulting in high thermal loads which are generated as pulsed, high heat flux (Watts per $cm^2$) loads. Compounding the thermal management problem can be a desire to maintain close tolerance on operating temperature for laser diodes in order to reduce (e.g., minimize) spectral drift. Beam spectral drift complicates beam combining (e.g., employed for high power lasers) and can use additional powered components to correct, which further exacerbates system level power and thermal management problems. Thermal management, which can represent 50% of the overall size and weight of the laser system, can be a critical technology barrier to achieving reduced system size and weight for practical implementation.

The use of an expendable coolant medium (e.g. liquid nitrogen, methanol, water) can improve the cooling of laser systems with less than 20% of the size, weight and power demand of other approaches. In one embodiment, heat is adsorbed during phase change of the expendable coolant (e.g., liquid to vapor) and then rejected from the host platform; no active refrigeration cycle or thermal energy storage material is used, which greatly reduces the size, weight and power consumption of the system. During phase change, heat can adsorbed at near constant pressure and temperature and can meet high thermal heat fluxes associated with high energy laser systems. In this embodiment, the temperature and pressure at which the heat adsorbing phase change occurs can be actively controlled allowing for tailoring of the thermal management system to a wide range of laser diode operating temperatures.

Figure 8:
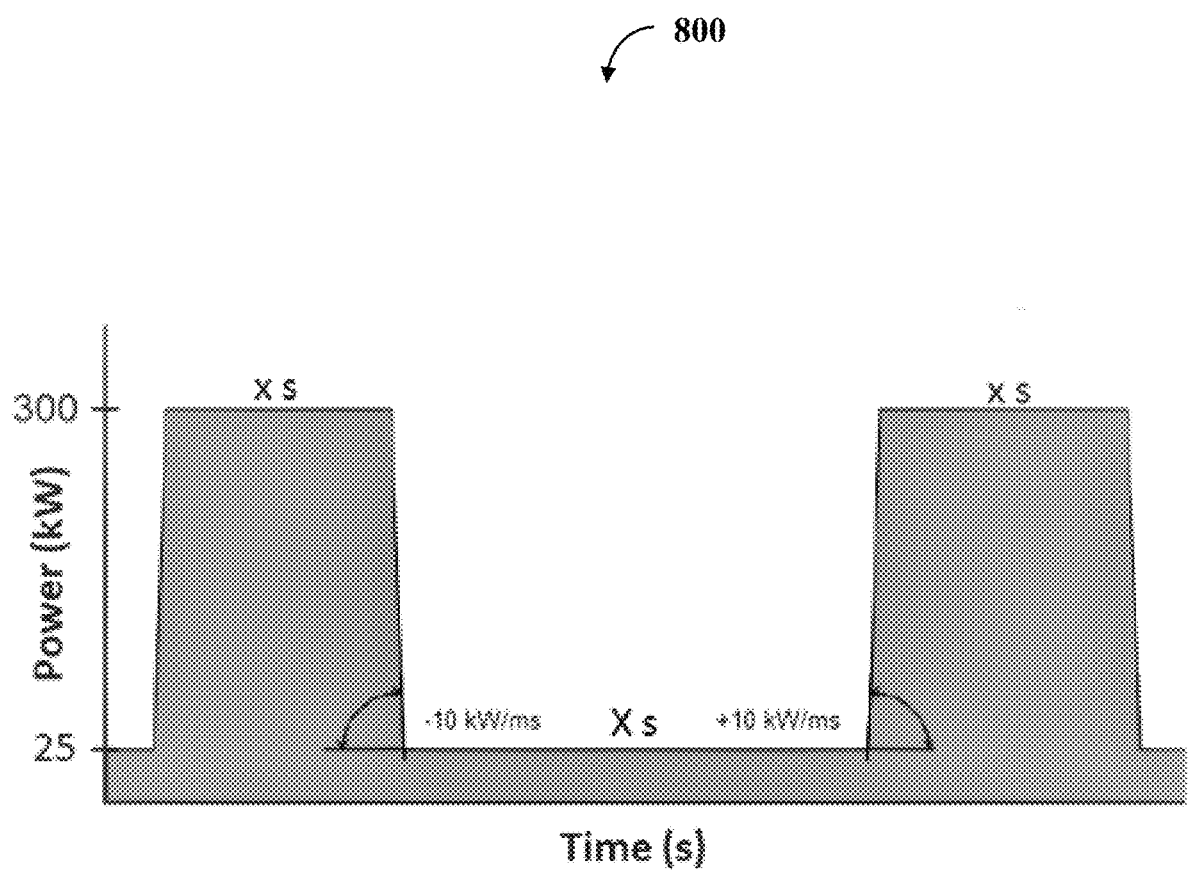
FIG. 8 illustrates one embodiment of a graph 800 displaying a pulsed power demand of a 100 kW system.

FIG. 8 illustrates one embodiment of a graph 800 displaying a pulsed power demand of a 100 kW system. While the system can be 100 kW, the imposed base load can be 25 kWe. Based on a wall-plug optical efficiency (e.g., (laser optical power out/electrical power in)*100%) of 33.3%, a high energy laser (HEL) peak electrical load demand of 300 kW can be appropriate (e.g., not including the thermal management system). The HEL load can represent a significant increase over the base load. For the load illustrated in the graph 800, the HEL pulse duration is x seconds and is followed by a dwell time of X seconds, prior to the next pulse. Peak power, pulse duration, number of pulses (e.g., bursts) can be variables determined by various factors, such as environmental conditions. The rate that the load is applied, termed slew rate, can be in the range of +5 kW/ms to +20 kW/ms (shown in FIG. 8 as +10 kW/ms). The number of pulses defined for a mission multiplied by pulse time is termed the magazine depth (in units of time; usually seconds or minutes); magazine depth determines the needed power and thermal management capacity, and energy storage (both electrical and thermal energy storage) capability of the laser system (e.g., that employs the laser diode set 130 of FIG. 1).

Due to a relatively low overall efficiencies of HEL system, a substantial quantity of pulsed thermal energy can be rejected from a diode-pumped fiber laser. The overall wall-plug efficiency of solid state lasers can vary (e.g., from 25% to 45%), resulting in a large thermal load to be managed. The waste heat at the base of the laser diode substrate can be rejected at fairly high thermal fluxes which can vary (e.g., from approximately 300 W/cm$^2$ to 600 W/cm$^2$ (potentially higher thermal fluxes can be experienced if little thermal spreading occurs)). These heat fluxes can be well above the capability of at least some air cooled heat exchanger fluxes of around 10 W/cm$^2$ to 30 W/cm$^2$. Additionally, laser diodes can be sensitive to temperature fluctuations (e.g., having operating temperature of ±2° C. of the nominal laser diode cold plate temperature). Also, inhomogeneity within a thermal heat sink can affect the performance (e.g., alter the wavelength of laser light produced) of solid state lasers. These factors can make thermal management a challenging and critical design element of directed energy systems.

Figure 9:
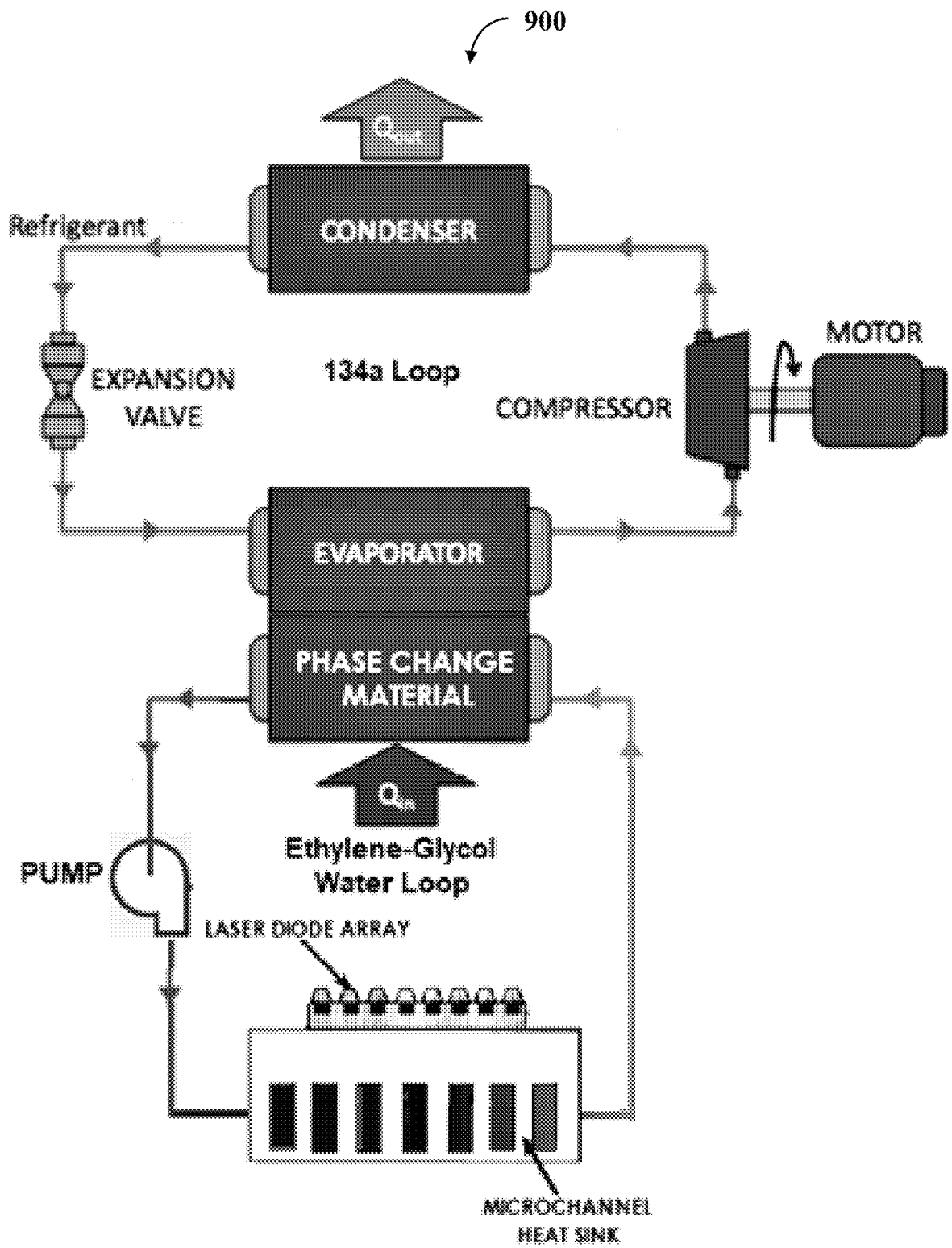
FIG. 9 illustrates one embodiment of a thermal management system.

FIG. 9 illustrates one embodiment of a thermal management system (TMS) 900 for a diode-pumped high energy laser diode apparatus. The system 900 is illustrated during a laser firing event, such as when heat is adsorbed by the phase change material. An approach to thermal management of high energy laser diodes can be practiced by the system 900. The approach includes a vapor cycle (VC) refrigeration system (e.g., using refrigerant 134a as the working fluid) and a secondary ethylene-glycol-water (EGW) single phase laser diode cooling loop. The VC system and EGW loop are coupled together via a heat exchangers and a phase change material assembly. Phase change materials (PCMs) adsorb heat rejected from the pulsed laser diode over a short timeframe and then reject the adsorbed thermal energy over a longer time frame, thereby, reducing the needed refrigeration maximum thermal capacity.

Figure 10:
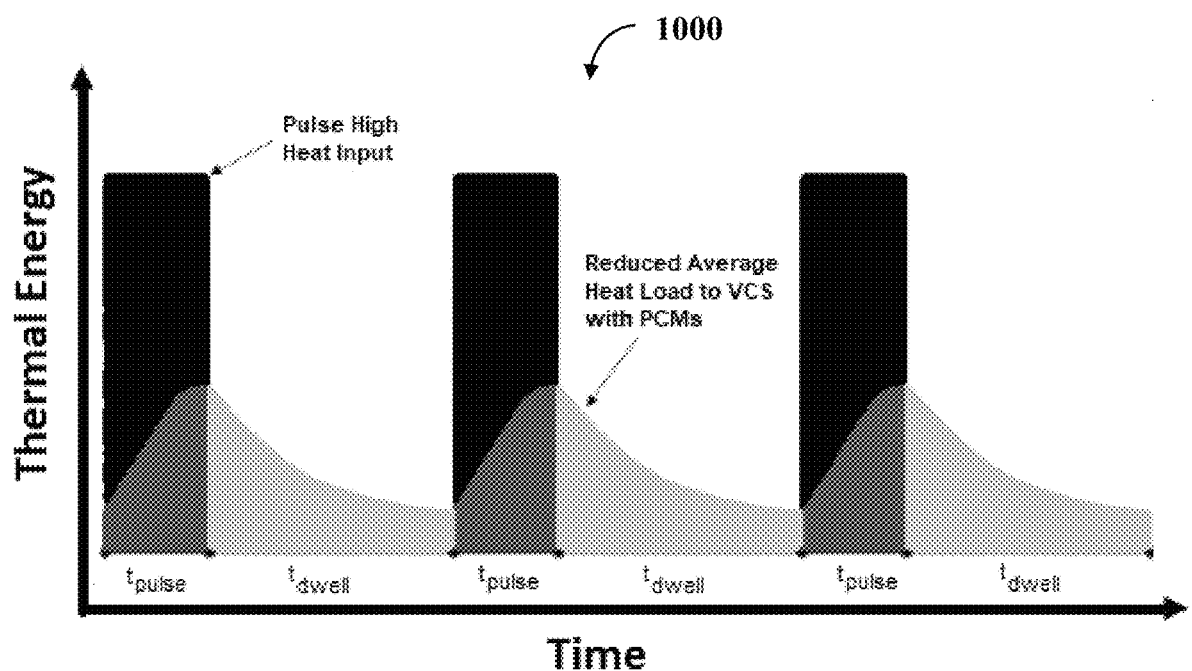
FIG. 10 illustrates one embodiment of a graph displaying a smoothing of a pulsed thermal load with phase change materials.

FIG. 10 illustrates one embodiment of a graph 1000 displaying a smoothing of a pulsed thermal load with phase change materials. The pulse thermal load (and the thermal demand when PCMs are incorporated) displayed by the graph 1000 can be from operation of the system 900 of FIG. 9. The pulsed thermal heat from the laser diode is shown in higher black blocks and the thermal load rejected from the PCMs as seen by the VC system is shown in the lower grey blocks. The effect of using PCMs is to reduce both the peak and average thermal load to the VC system which reduces the VC power draw, size and weight. Phase change materials provide good heat adsorption capacity (e.g., paraffinic PCM thermal capacity ~250 kJ/kg, PCM assembly capacity ~110 kJ/kg), but are heavy (e.g., paraffinic PCM density ~250 kg/m$^3$, typical PCM assembly density is ~500 kg/m$^3$). The weight and power demand of the SOA thermal management system (e.g., the system 900 of FIG. 9) can be, in one example, approximately 10 kg/kW$_{optical\ rating}$, L/kW$_{optical\ rating}$ and 120 W/kW$_{optical\ rating}$ (e.g., kW$_{optical\ rating}$ can be the nominal optical output of the a laser system).

FIG. 11 illustrates on embodiment of a table 1100 comparing fluids as coolants. These coolants can be expendable coolants and those listed in the table 1100 are examples. Expendable coolants can be a coolant that adsorbs heat via phase change (e.g., under near constant temperature and pressure conditions) and is then rejected from the system. This approach reduces (e.g., eliminates) the active cooling components of a thermal management system (e.g., vapor cycle system, secondary cooling loops, thermal energy storage material, etc.) which can significantly reduce the thermal management system size, weight and power requirements. The table 1100 illustrates a comparison of some example expendable coolants for diode-pumped solid state laser applications. Some cryogenic expendable coolants (e.g. liquid nitrogen) can be used with laser diodes, but availability of replenishments and boil-off losses are a concern. In view of the table 1100, water provides the greatest ability to absorb thermal energy, followed by methanol and ammonia. As a comparison, the heat of vaporization of water is 2257 kJ/kg—almost an order of magnitude greater than the thermal adsorption capability of a good paraffinic PCM at 250 kJ/kg. However, the saturation temperature of water is 100° C., so for laser diodes operating below 100° C., a partial vacuum can be applied to reduce the pressure and drop the saturation temperature. In addition to water, a different high boiling point coolant operating under partial vacuum conditions can be used (e.g., a high boiling point coolant being a coolant whose boiling point at the application operating pressure, exceeds the operating temperature of the laser diode).

Figure 12A:
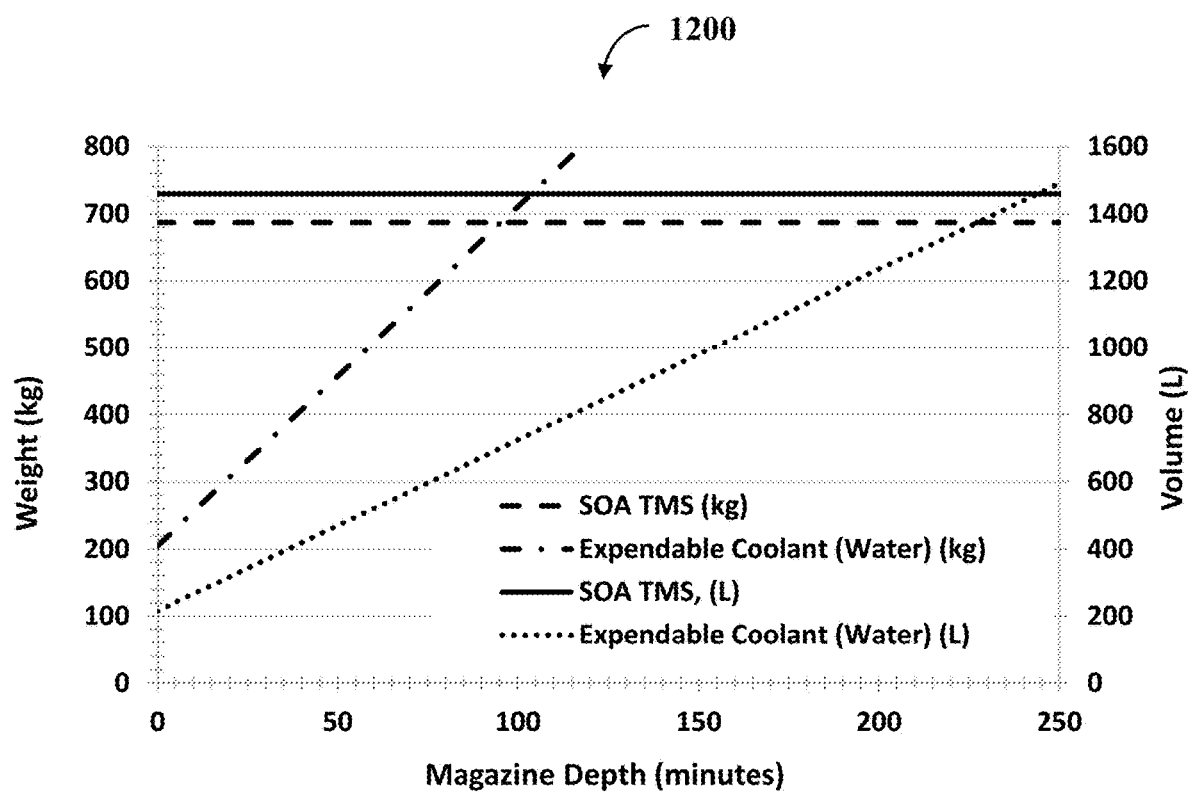
FIG. 12A illustrates on embodiment of a graph displaying an effect of magazine depth on thermal management system size and weight.
Figure 12B:
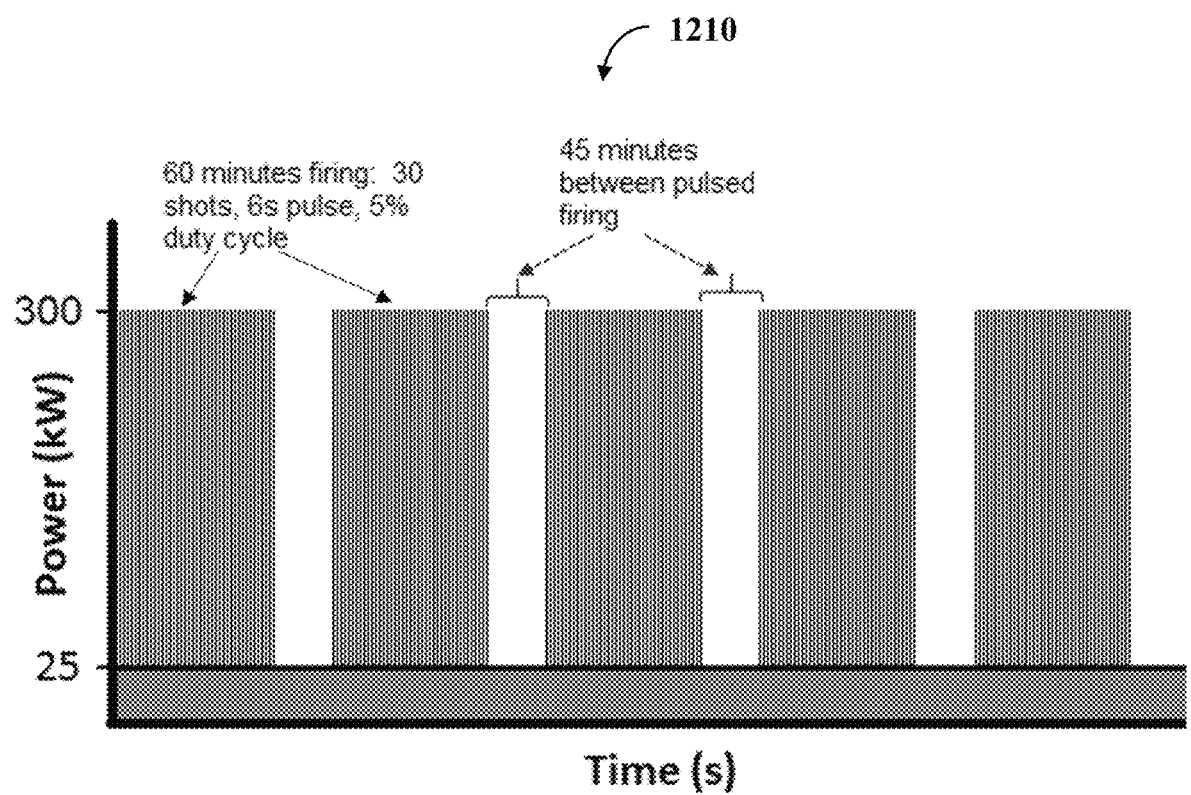
FIG. 12B illustrates on embodiment of a graph displaying a laser firing sequence.

FIG. 12A illustrates on embodiment of a graph 1200 displaying an effect of magazine depth on thermal management system size and weight for a 100 kW system with resulting power demands of 9.3 kWe (SOA TMS) and 3.6 kWe (expendable coolant). FIG. 12B illustrates one embodiment of a graph 1210 displaying a laser firing sequence that can be employed in the analysis of the graph 1200. A desirable expendable coolant can have large latent heat of vaporization, therefore, a fairly modest amount of an expendable coolant could potentially provide substantial saving in SWaP for a HEL system. Also, a desirable expendable coolant can have a saturation temperature near the desired heat rejection temperature (e.g., for the HEL system at or near the laser diode operating temperature). Applications with operating temperature above or below the coolant saturation temperature can be used with temperature moderating approaches (e.g. secondary coolant loops or partial vacuums). These moderating approaches might reduce SWaP improvements, but may still result in attractive thermal management system (TMS) schemes.

In one embodiment, the use of expendable coolants can be beneficial at modest magazine depths as specified in at least some HEL applications. As an example, the graph 1200 illustrates a comparison between a baseline state-of-the-art (SOA) TMS approach (vapor cycle system with secondary EGW loop and PCMs) and an expendable coolant approach (water under a partial vacuum), with a laser diode operating temperature of 65° C. Both thermal management approaches assume 30, 6 s shots (5% duty cycle), followed by a 45 minute recovery time (cycle is repeated based on desired magazine depth) as depicted in the graph 1210. At a magazine depth of three minutes, the expendable coolant looks very promising with a 68% reduction in weight, an 84% reduction in volume and a 61% reduction in power consumption. As the magazine depth increases the advantage of the expendable coolant diminishes resulting in no advantage in weight with a 95 minute magazine depth and no advantage in volume at a 244 minute magazine depth. These large magazine depths are substantially longer than a possible desirable 2-4 minutes length range. So, for most HEL applications, the use of expendable coolants appears to offer significant size, weight and power improvement.

Figure 13A:
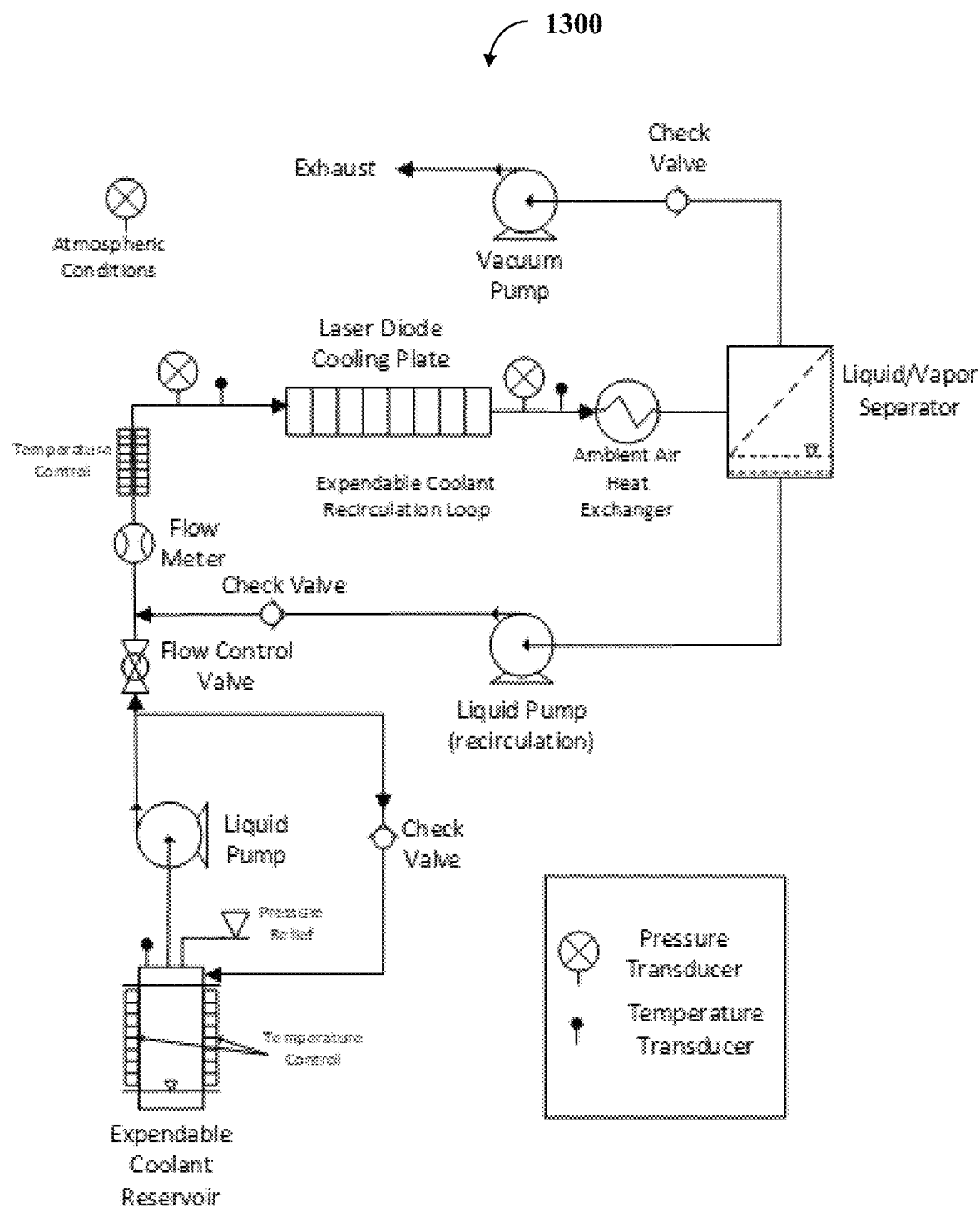
FIG. 13A illustrates on embodiment of a system with a design for an expendable coolant for constant temperature heat rejection from diode-pumped solid state lasers using a high boiling point coolant.
Figure 13B:
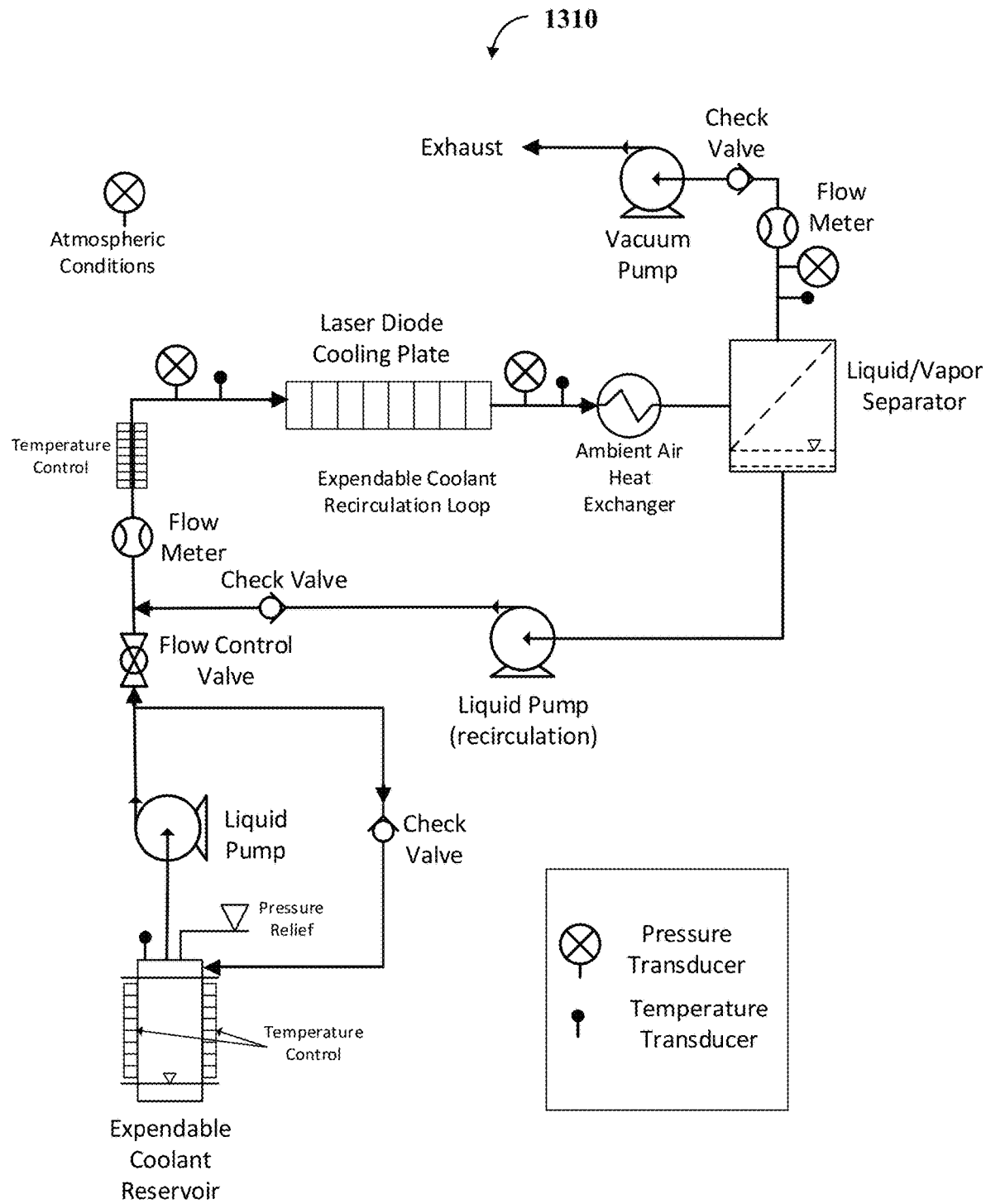
FIG. 13B illustrates on embodiment of a system with a design for an expendable coolant for constant temperature heat rejection from diode-pumped solid state lasers using a high boiling point coolant with cooling plate vapor flow measurement.

FIG. 13A illustrates on embodiment of a system 1300 with a design for an expendable coolant for constant temperature heat rejection from diode-pumped solid state lasers using a high boiling point coolant. FIG. 13B illustrates on embodiment of a system 1310 with a design for an expendable coolant for constant temperature heat rejection from diode-pumped solid state lasers using a high boiling point coolant with cooling plate vapor flow measurement. The system 1300 and 1310 can be examples of systems that use a high boiling point coolant (e.g. water) for cooling applications which desire to have heat rejection below the coolant boiling point. By creating at least a partial vacuum condition, the boiling point of the coolant can be adjusted. Further, under two-phase heat transfer conditions, heat is adsorbed by the coolant at near-constant temperature. Constant temperature heat absorption (or low temperature fluctuation during heat adsorption) is beneficial for proper operation of diode-pumped solid state lasers and a significant constraining design criteria affecting the size, weight and power consumption of HEL systems. Using coolants based on their physical and thermophysical properties (e.g., heat of vaporization, heat transfer characteristics, saturation temperature, mass, etc.) can allow for application tailoring.

The expandable coolant reservoir (e.g., reservoir 150 of FIG. 1) can be a vessel which contains the coolant (e.g., water in liquid state). The coolant reservoir can incorporate level switches to indicate the status of the quantity of coolant available. The vessel's temperature is monitored and controlled (e.g., by a controller component) to raise or lower the temperature (e.g. thermoelectric heater/cooler), shown in the figure as 'temperature control". The temperature of the coolant can be held within an acceptable temperature range dictated by the allowable operating temperature of the laser diode cooling plate (e.g., cooling plate 160 of FIG. 1). The temperature of the entire quantity of coolant can be controlled; alternatively, the heating/cooling of the coolant can be accomplished by an in-line heating/cooling apparatus located downstream of the expendable coolant reservoir that heats or cools the coolant on an as-needed basis.

The pressure relief valve can be used to maintain a maximum allowable pressure within the tank of the reservoir vessel which is a function of the vessel's structural design. This valve can be managed by the control component. There can also be a coolant flow return line, which is a function of flow control of coolant to the laser diode cooling plate.

If the system 1300 (or 1310) is exposed to cold environments which could result in freezing of the expendable coolant, the expendable coolant reservoir can incorporate a shut-off valve at the exit of the reservoir to isolate the expendable coolant reservoir from the remainder of the system 1300 and the vacuum pump (e.g., same as the vacuum pump 120 of FIG. 1) can be operated to expel remaining liquid in the system 1300. Further, if the expendable coolant expands upon freezing (e.g., water), a pressurize bladder can be added to the expendable coolant reservoir to accommodate the increase in volume.

The liquid pump can provide coolant flow from the expendable coolant reservoir to the laser diode cooling plate circuit when the HEL system is activated. Activation can precede laser use and supports preconditioning the laser diode cooling plate to establish the design operating temperature. The liquid pump is illustrated as an external pump, but can be located within the expendable coolant reservoir.

The flow control valve can be a one-way variable flow valve that controls downstream flow, such as based on a selected, predetermined setting or via pressure/temperature measurements and algorithms (e.g., associated with the laser diode cooling plate). The flow control valve can an active part of the coolant flow control and have a variable and controllable output setting. Also, the flow control valve can serve to maintain a partial vacuum on the expendable coolant recirculation loop (e.g., isolates the expendable coolant recirculation loop (under at least partial vacuum) from the expendable coolant feed system), the loop being part of the recirculator 190 of FIG. 1.

The return line take excess coolant flow from the liquid pump and recirculate it back to the expendable coolant reservoir by way of the return line. A check valve can guard against backflow from the expendable coolant reservoir.

The flow meter can provide measurement of coolant flow (e.g., combination of flow from the expendable coolant reservoir and recirculation flow coolant) going to the laser diode cooling plate. The flow meter can also measure flow from the expendable coolant reservoir and expendable coolant recirculation loop. The flow meter can comprise a liquid flow meter and a vapor flow meter. Data from this flow meter can be used to control the flow from the flow control valve and the reservoir liquid pump, such as used by the control component.

The expendable coolant temperature can be controlled at the expendable coolant reservoir. However, there could be some (e.g., some small) variation in temperature due to heat transfer with the environment and via the expendable coolant recirculation loop. A device to cool and heat the expendable fluid can be employed just prior to the laser diode cooling plate entrance to ensure the desired temperature is obtained. The device can be a thermoelectric device or other device that can both heat or cool the expendable fluid as appropriate.

The laser diode cooling plate can be implemented as a heat sink constructed as a micro/mini-channel heat transfer device or other heat transfer device. The plate can be attached to the laser diode substructure. The microchannel heat sink can support the heat rejection from a number of laser diodes. Proximity of the laser diode to the heat sink can dictate the allowable delta temperature of the coolant between the inlet and outlet of the cooling plate. Temperature and pressure measurements can be made at the inlet and outlet of the cooling plate and employed by the control component to manage operation of the system 1300.

There can be a relationship between coolant vapor quality, coolant mass flux (G) and the micro/mini-channel wall heat transfer coefficient of the laser diode cooling plate. In one embodiment, the wall heat transfer coefficient is not very sensitive to coolant mass flux, but can be a function of the coolant vapor quality, with the maximum wall heat transfer coefficient occurring at a vapor quality of 0.2 to 0.25. The heat rejected from the laser diodes to the cooling plate and the pressure drop, as a function of coolant mass flow rate, through the micro/mini-channel cooling plate can be determined by a determination component. The determination component can calculate, based on knowledge of the thermophysical properties of the coolant, coolant flow rate, temperature and pressure within the cooling plate, and the heat being rejected to the coolant through the cooling plate. The determination component can then provide the control component necessary information to allow for proper system control to maintain operation at preferred heat transfer conditions. The vapor quality can be actively controlled by adjusting the coolant flowrate (e.g., adjustment through the liquid pump and flow control valve). Operating at the preferred (e.g. optimum) vapor quality can result in lower (e.g., the lowest) coolant flow rate and microchannel pressure drop; lowering (e.g. minimizing) pumping power and reducing overall system size and weight.

In one embodiment, the system 1300 can employ a gas flow meter is with temperature and pressure transducers. This can be downstream of the liquid/vapor separator. With this, a desired (e.g. maximum) coolant vapor quality can be determined directly. This vapor quality can, as above, be controlled (e.g., optimized) by adjusting the coolant flowrate.

Coolant exiting the laser diode cooling plate can be a two-phase mixture of vapor and liquid. The liquid/vapor separator (e.g., separator 180 of FIG. 1) can separate the vapor from the liquid. The vapor is exhausted to the local environment and the liquid is collected and returned to the expendable coolant recirculation loop that can be part of the recirculator 190 of FIG. 1. The liquid/vapor separator can be equipped with a liquid level switch which activates a recirculation pump to recirculate collected coolant and also maintains a liquid seal in the liquid/vapor separator.

The liquid pump in the coolant recirculation loop can be activated by the liquid/vapor separator level control switch. The liquid pump can recirculate expendable coolant into the cooling loop. Liquid leaving the liquid pump can pass through a check valve to prevent reverse flow.

The vacuum pump can create the system vacuum which is a function of the expendable coolant physical properties appropriate for two-phase operation and the desirable operating temperature for the laser diode cooling plate. A temperature transducer associated with the laser diode cooling plate can be used to set the vacuum pump operating pressure. The vacuum pressure can be actively controlled to vary the cooling loop temperature, such as preconditioning the system temperature prior to powering the laser diodes or to return the cooling loop to its initial temperature conditions prior to another HEL firing. Local environmental pressure from the atmospheric pressure transducer can be used to determine the initial vacuum pressure setting for the vacuum pump. Flow to the vacuum pump can flow through a check valve to prevent back flow and also to maintain the integrity of the partial vacuum in the expendable coolant loop.

The systems 1300 and 1310 can also be configured with other features. In one embodiment, an atmospheric pressure transducer can measure local atmospheric pressure that the determination component can use in predetermining set points for the vacuum pump. Further, various features can employ insulation to lower (e.g., minimize) thermal losses.

The use of expendable coolants under partial vacuum is an approach to significantly reduce the size, weight and power consumption of thermal management systems associated with diode-pumped solid state laser systems. The use of expendable coolants can reduce (e.g., eliminate) refrigerant cycles (e.g. vapor cycle systems or air cycle system), secondary cooling loops (e.g., ethylene glycol water, R-134a, etc.) and thermal energy storage via phase change materials.

What is claimed is:

1. A laser diode cooling system, comprising:
a cooling apparatus configured to cool a laser diode set through employment of a coolant; and
a vacuum pump configured to keep the coolant at less than an atmospheric pressure of the laser diode set,
where the cooling apparatus comprises a cooling plate configured to receive a pass through of the coolant such that the pass through of the coolant causes the laser diode set to be cooled,
where the cooling apparatus comprises a recirculator configured to recirculate at least part of the coolant,
where the cooling apparatus comprises a separator configured to separate the coolant that passes through the cooling plate to a vapor part and a liquid part,
where the liquid part is the recirculated coolant,
where the vapor part is released into an environment of the laser diode cooling system,
where the cooling apparatus cools the laser diode set during a first cooling phase with coolant from a reservoir,
where the cooling apparatus cools the laser diode set during a second cooling phase with the recirculated coolant, and
where the first cooling phase occurs before the second cooling phase.

2. The laser diode cooling system of claim 1,
where the vapor part is within a range of about 20% to about 30% of the coolant that passes through the cooling plate and
where the liquid part is within a range of about 70% to about 80% of the coolant that passes through the cooling plate.

3. The laser diode cooling system of claim 1, the cooling apparatus comprising:
a condenser configured to condense the liquid part before being recirculated.

4. The laser diode cooling system of claim 1,
where the coolant is water.

5. A laser diode cooling system, comprising:
a cooling apparatus configured to cool a laser diode set through employment of a coolant, the cooling apparatus comprising a reservoir coupling hardware configured to couple and decouple with a first reservoir and configured to couple and decouple with a second reservoir; and
a vacuum pump configured to keep the coolant at less than an atmospheric pressure of the laser diode set,
where the first reservoir is of a first size,
where the second reservoir is of a second size,
where the first size is different than the second size,
where the cooling apparatus is configured to operate with a first coolant retained by the first reservoir when the first reservoir is coupled to the reservoir coupling hardware, and
where the cooling apparatus is configured to operate with a second coolant retained by the second reservoir when the second reservoir is coupled to the reservoir coupling hardware after the first reservoir has been coupled and decoupled from the reservoir coupling hardware.

6. A laser diode set cooling system, comprising:
a reservoir coupling hardware configured to couple and decouple with a reservoir containing a coolant;
a laser diode cooling plate configured to pass through the coolant from the reservoir; and
a recirculation hardware configured to cause at least part of the coolant to pass through the laser diode cooling plate a subsequent time after an initial time,
where the coolant passing through the laser diode cooling plate causes a laser diode set to cool and
where the coolant is supplied to the laser diode cooling plate at a pressure less than an atmospheric pressure of the laser diode set,
Where the reservoir containing the coolant is a first reservoir containing a first amount of the coolant, and
where the reservoir coupling hardware is configured to couple and decouple with a second reservoir containing a second amount of the coolant after the first reservoir is decoupled and no longer coupled to the reservoir coupling hardware.

7. The laser diode set cooling system of claim 6,
a separator configured to separate the coolant that passes through the laser diode cooling plate after the initial time to a vapor part and a liquid part,
where the separated liquid part is the coolant that passes through the laser diode cooling plater the subsequent time and where the vapor part is released into an environment of the laser diode cooling system.

8. The laser diode set cooling system of claim 7, where the vapor part is within a range of about 20% to about 30% of the coolant that passes through the cooling plate after the initial time and
where the liquid part is within a range of about 70% to about 80% of the coolant that passes through the cooling plate after the initial time.

9. The laser diode set cooling system of claim 8, where the coolant is water and
where the first reservoir and the second reservoir are different sizes.

10. A method to cool a laser set by way of a laser cooling system, the method comprising:
extracting a first amount of a coolant from a first coolant reservoir;
cooling the laser set through employment of the first amount of the coolant;
extracting a second amount of a coolant from a second coolant reservoir; and
cooling the laser set through employment of the second amount of the coolant,
where the second coolant reservoir physically replaces the first coolant reservoir such that the first coolant reservoir and second coolant reservoir are not coupled to the laser cooling system concurrently.

11. The method of claim 10, comprising:
cooling the laser set through employment of the first amount of the coolant during a first iteration;
separating the first amount of the coolant to a first vapor portion and a first liquid portion after the first iteration; and
cooling the laser set through employment of the first liquid portion during a second iteration that follows the first iteration.

12. The method of claim 11, comprising:
Condensing the first liquid portion before so that the laser set is cooled through employment of a condensed version of the first liquid portion during the second iteration that follows the first iteration.

13. The method of claim 12, comprising:
creating a vacuum environment for the laser cooling system,
where cooling the laser set through employment of the first amount of the coolant occurs with the coolant at less than atmospheric pressure of the laser set due to the vacuum environment and
where cooling the laser set through employment of the second amount of the coolant occurs with the coolant at less than atmospheric pressure of the laser set due to the vacuum environment.

14. The method of claim 13,
where the coolant is water and
where the first coolant reservoir and the second coolant reservoir are different sizes.

15. The method of claim 14,
where the first vapor portion is released into an environment of the laser cooling system and
where separating the first amount of the coolant to a first vapor portion and a first liquid portion after the first iteration results in a ratio range of about 20% to about 30% of the first vapor portion.

* * * * *